(12) United States Patent
Kumamoto

(10) Patent No.: US 6,589,853 B2
(45) Date of Patent: Jul. 8, 2003

(54) METHOD OF FORMING A TRENCH ISOLATION STRUCTURE HAVING A SECOND NITRIDE FILM

(75) Inventor: Keita Kumamoto, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/106,161

(22) Filed: Mar. 26, 2002

(65) Prior Publication Data

US 2002/0142564 A1 Oct. 3, 2002

(30) Foreign Application Priority Data

Mar. 28, 2001 (JP) ........................................ 2001-093056

(51) Int. Cl.[7] ...................... H01L 21/76; H01L 21/425
(52) U.S. Cl. ...................... 438/424; 438/430; 438/435; 438/524
(58) Field of Search ............................. 438/424, 430, 438/435, 524

(56) References Cited

U.S. PATENT DOCUMENTS

| 6,140,208 A | * | 10/2000 | Agahi et al. |
| 6,180,493 B1 | * | 1/2001 | Chu |
| 2002/0031890 A1 | * | 3/2002 | Watanabe et al. |

FOREIGN PATENT DOCUMENTS

JP 2000-12677 1/2000

OTHER PUBLICATIONS

English Bibliography and Abstract of JP 2000–12677 (cited above).

* cited by examiner

Primary Examiner—John F. Niebling
Assistant Examiner—Stanetta Isaac
(74) Attorney, Agent, or Firm—Darryl G. Walker; Bradley T. Sako

(57) ABSTRACT

A semiconductor device including an insulating film (6) embedded in a concave portion, such as a trench (T) formed on a semiconductor substrate (1) is disclosed. A method of forming a trench isolation structure may include forming a mask layer having a predetermined opening pattern. The mask layer may include a nitride film (3). A trench (T) may be formed through etching using a mask layer as a mask. A thermal oxide film (4) may be formed on an inner wall of a trench (T). An insulating film (11) may be formed on an entire main surface of a semiconductor substrate (1). Insulating film (11) may provide an etching barrier. A nitride film liner (5) may be formed on an insulating film (11). An embedding insulating film (6) may be formed so as to essentially fill trench (T). A planarization treatment may be conducted so as to expose nitride film (3). Nitride film (3) may then be removed by isotropic etching. In this way, a formation of a groove along an edged of a trench isolation structure may be suppressed while sufficient device characteristics may be obtained.

15 Claims, 10 Drawing Sheets

(a)

(b)

US 6,589,853 B2

METHOD OF FORMING A TRENCH ISOLATION STRUCTURE HAVING A SECOND NITRIDE FILM

TECHNICAL FIELD

The present invention relates generally to a semiconductor device and method of manufacturing the same and more particularly to a semiconductor device that may have an insulating film embedded in a concave portion formed in a semiconductor substrate and a method of forming the same.

BACKGROUND OF THE INVENTION

It is a continuing goal to increase the integration level of semiconductor devices. In order to do so, it is desirable to make device structures and device isolation structures smaller. One method of providing smaller device isolation structures is to use a trench isolation structure in place of a conventional local oxidation of silicon (LOCOS) method.

A conventional trench isolation method will now be described with reference to FIGS. 7 and 8. The conventional trench isolation method includes forming a concave portion or trench inside a semiconductor substrate. The trench is etched in a silicon substrate to a depth required for isolation between adjacent devices, forming an insulating film to fill the trench, and then removing the insulating film located outside the trench with a flattening step.

FIGS. 7 and 8 are cross-sectional diagrams of a conventional trench isolation structure after various process steps.

Referring now to FIG. 7(a), a silicon oxide film 102 and a silicon nitride film 103 are formed sequentially on a silicon substrate 101. Next, a resist pattern (not shown) is formed and etched to expose silicon nitride film 103 located over a region (non-active region) where a trench is to be formed. Then, using the resist pattern as a mask, silicon nitride film 103 and silicon oxide film 102 are etched sequentially until the surface of silicon substrate 101 is exposed. The resist pattern is then removed, the exposed silicon substrate 101 is etched using silicon nitride film 103 as a mask to form a trench T.

Referring now to FIG. 7(b), a thermal oxide film 104 is formed on the inner wall surface of trench T. Thermal oxide film 104 helps to compensate for damage to the surface of the substrate 101 caused the above-mentioned etching carried out to form trench T. Thermal oxide film 104 also helps to prevent dislocation from occurring inside the substrate 101 by rounding off the corners of trench T to relieve stress.

Referring now to FIG. 7(c), a nitride film liner 105 is then formed over the surface and an embedding insulating film 106 is then formed on the surface to fill trench T. Nitride film liner 105 is formed to prevent oxygen from infiltrating inside the wall of trench T through embedding insulating film 106 in a subsequent oxidation step, or the like. In this way, the trench walls may be prevented from being further oxidized. If oxygen infiltrates the wall of trench T, silicon in that portion is oxidized and increases in volume to produce stress. This can cause defects such as dislocation, or the like, which can cause device characteristics to deteriorate.

Referring now to FIG. 8(a), chemical mechanical polishing (CMP) is carried out until silicon nitride film 103 is exposed to flatten the surface of the substrate.

Referring now to FIG. 8(b), silicon nitride film 103 formed over the region (active region) other than the non-active region of the substrate 101 is removed by wet etching. At this time, if the thickness of nitride film liner 105 is thick, nitride film liner 105 is etched deep inside the trench. As will be illustrated later, this causes a groove to be formed in this region in a subsequent step.

Referring now to FIG. 8(c), silicon oxide film 102 over the active region and a protruding portion of embedding insulating film 106 in the non-active region are removed in a wet washing step (wet etching) to form a target trench isolation structure. At this time, a groove D is formed along the edge of the device isolation region (trench isolation region) formed with the insulating film embedded in the trench. Groove D is caused due to a part of nitride film liner 105 being etched inside the trench (illustrated in FIG. 8(b)).

When groove D is deep and/or wide, an electrically conductive material tends to remain inside groove D in a later step of forming gate electrode. This can cause short circuit failure in these gate electrodes. Also, the electric field of the gate electrodes can be increased in the substrate corners defined by groove D. Such an increased electric field causes instability in device characteristics, such as threshold voltage, which causes undesirable effects such as an increase of leakage currents, or the like. In order to suppress the formation of groove D, it is desirable that nitride film liner 105 has a relatively thin film thickness.

Japanese Patent Application Laid-Open No. 2000-12677 (JPA 12677) describes a method of forming a conventional trench isolation structure such that groove D may be suppressed. A conventional trench isolation structure disclosed in JPA 12677 will be discussed with reference to FIGS. 9 and 10.

Referring now to FIG. 9(a), silicon oxide film 102 and silicon nitride film 103 are formed on substrate 101. Silicon nitride film 103 is then patterned and etched. Etching the exposed surface of substrate 101 to form trench T is done in the same manner as the conventional approach illustrated in FIG. 7(a). Thermal oxide film 104 is then formed on an inner wall of trench T in the same manner as previously described and illustrated in FIG. 7(b).

Referring now to FIG. 9(b), silicon nitride film 103 is isotropically etched by a predetermined thickness. By isotropic etching, not only the upper surface of silicon nitride film 103, but also lateral surface portions are etched. In this way, the diameter of the opening in silicon nitride film 103 is enlarged with respect to that of trench T. As a result, a brim-like portion where the surface of substrate 101 or oxide film 102 is exposed around the opening portion of trench T and a step-like shape is obtained.

Referring now to FIG. 9(c), nitride film liner 105 is formed on the surface of substrate 101 in the same manner as previously described and illustrated in FIG. 7(c). Then, embedding insulating film 106 is formed so as to fill the inside of trench T.

Referring now to FIG. 10(a), CMP is carried to planarize the surface and expose the silicon nitride film 103 in the same manner as previously discussed and illustrated in FIG. 8(a).

Referring now to FIG. 10(b), silicon nitride film 103 is removed by isotropic etching (wet etching). During the isotropic etching, nitride film liner 105 is also gradually removed from the exposed edge. However, because the brim-like portion serves as a buffer, excessive etching which reaches the inside of the trench is prevented even though nitride film liner 105 on the brim-like portion is removed by etching. Thus, groove D is prevented from being formed in the wet washing step and trench isolation structure is formed as illustrated in FIG. 10(c).

The above-mentioned JPA 12677 reference discloses an alternative way of forming a brim-like portion around the opening edges of trench T in another embodiment as will be discussed with reference to FIG. 11.

Referring now to FIG. 11(a), after silicon oxide film 102 and silicon nitride film 103 are sequentially etched to form an opening so as to expose a surface silicon substrate 101 in an inactive region, an oxide film is formed on the entire surface. The oxide film is then etched back by anisotropic etching to form spacers 107 on lateral walls of the opening.

Referring now to FIG. 11(b), the exposed portion of substrate 101 is etched using spacers 107 and silicon nitride film 103 as masks to form trench T.

After removal of spacers 107, a thermal oxide film is formed on the inner wall of trench T. In this way, a step-like shape similar to that illustrated in FIG. 9(b) is obtained where a brim-like portion is formed around the opening portion of the trench T.

In order to ensure a sufficient width in the brim-like portion using the method described in the above-mentioned JPA 12677, it is necessary to either increase the amount of wet etching for the nitride film so as to enlarge the opening in the silicon nitride film 103 shown in FIG. 9(b) or to thicken spacers 107 shown in FIG. 11(a). However, if the amount of wet etching for the nitride film is increased, silicon nitride film 103 is thinned. This can reduce the effectiveness of the silicon nitride film 103 as a polishing stopper in the later CMP step. On the other hand, ensuring a sufficient width of spacers 107 prevents the reduction in the width of the active region between trenches, which reduces the miniaturization of the device and increases production costs.

Also, because it is difficult to uniformly form the width of the brim-like portion due to manufacturing fluctuations, the nitride film liner 105 formed on the brim-like portion may not be completely removed in the nitride film wet etching step and may partially remain in the active region. The remaining nitride film liner 105 on the active region can cause etching of the oxide film underlying the nitride film liner 105 in the oxide film wet etching step. As a result, a part of the nitride film liner 105 may remain resulting in an eave-like portion 108 as illustrated in FIG. 12. In a later step of forming a gate pattern, a gate electrode material or the like is likely to remain under the eave-like portion 108 of nitride film liner 105. This may result in a short circuit between gate electrodes.

In view of the above discussion, it would be desirable to provide a method of forming a trench isolation structure for a semiconductor device in which the formation of a groove along the edge of a trench region may be suppressed. It would also be desirable to provide a method of forming a trench isolation structure for a semiconductor device in which an undesired device material may be prevented from remaining in a region of the trench isolation structure during the formation of a gate pattern or the like. It would also be desirable to provide the above qualities while obtaining desired device characteristics and device isolation characteristics. It would also be desirable to provide a semiconductor device including a trench isolation structure including the above qualities.

SUMMARY OF THE INVENTION

According to the present embodiments, a semiconductor device including an insulating film embedded in a concave portion, such as a trench formed on a semiconductor substrate is disclosed. A method of forming a trench isolation structure may include forming a mask layer having a predetermined opening pattern. The mask layer may include a nitride film. A trench may be formed through etching using a mask layer as a mask. A thermal oxide film may be formed on an inner wall of a trench. An insulating film may be formed on an entire main surface of a semiconductor substrate. Insulating film may provide an etching barrier. A nitride film liner may be formed on an insulating film. An embedding insulating film may be formed so as to essentially fill trench. A planarization treatment may be conducted so as to expose nitride film. Nitride film may then be removed by isotropic etching. In this way, a formation of a groove along an edged of a trench isolation structure may be suppressed while sufficient device characteristics may be obtained.

According to one aspect of the embodiments, a method of forming a trench isolation structure in a semiconductor device may include the steps of forming a masking layer including an first oxidation-resistant insulating film on a semiconductor substrate and then forming a predetermined opening in the mask layer, etching an exposed portion of the semiconductor substrate using at least the mask layer as a mask to form a trench, forming a first insulating film on an inner wall of the trench, forming an etching barrier layer on at least a side portion of the mask layer at the predetermined opening pattern, forming a second oxidation-resistant insulating film on the inner wall of the trench including on the etching barrier layer, forming a second insulting film to essentially fill the trench, conducting a planarization treatment so that the first oxidation-resistant insulating film of the mask layer may be exposed, and removing a mask layer by etching.

According to another aspect of the embodiments, a method of forming a trench isolation structure in a semiconductor device may include the steps of forming a masking layer including an first oxidation-resistant insulating film on a semiconductor substrate and then forming a predetermined opening in the mask layer, forming an insulating film on a main surface of the semiconductor substrate and etching back the insulating film by anisotropic etching to form a sidewall on a lateral wall of the inside of the opening pattern in the mask layer, etching an exposed portion of the semiconductor substrate using at least the mask layer as a mask to form a trench, forming a first insulating film on an inner wall of the trench, forming a second oxidation-resistant insulating film on the inner wall of the trench including on the etching barrier layer, forming a second insulting film to essentially fill the trench, conducting a planarization treatment so that the first oxidation-resistant insulating film of the mask layer may be exposed, and removing a mask layer by etching.

According to another aspect of the embodiments, a semiconductor device including a trench isolation structure may include a trench formed in a semiconductor substrate. A second insulating film may be formed on a first insulating film. An oxidation insulating film may be formed on the second insulating film. An anti-static insulating film may be formed on an oxidation-resistant insulating film in a trench. An embedding insulating film may be formed to essentially fill an inside of a trench including the first insulating film, the second insulating film, the oxidation-resistant insulating film, and the anti-static insulating film.

According to another aspect of the embodiments, an exposed edge of a second oxidation-resistant barrier layer may be etched when a mask layer is removed by etching.

According to another aspect of the embodiments, an etching barrier layer may be formed on inner walls of the trench and at least a side portion of a mask layer.

According to another aspect of the embodiments, an etching barrier layer may include an oxide film having a thickness of about 5 nm to 30 nm.

According to another aspect of the embodiments, a first oxidation-resistant film may include a second nitride film having a thickness of about 4 nm to 20 nm.

According to another aspect of the embodiments, a method of forming a trench isolation structure may include forming an anti-static insulating film on the second oxidation-resistant insulating film by a thermal chemical vapor deposition (CVD) method. A second insulating film may be formed by a plasma CVD method.

According to another aspect of the embodiments, a plasma CVD method may be a high-density plasma CVD method.

According to another aspect of the embodiments, an anti-static insulating film may include an oxide film having a thickness of about 5 nm to 30 nm.

According to another aspect of the embodiments, a first insulating film may include a thermal oxide film.

According to another aspect of the embodiments, a sidewall may include an oxide film having a thickness of about 10 nm to 100 nm.

DETAILED DESCRIPTION OF THE EMBODIMENTS

Various embodiments of the present invention will now be described in detail with reference to a number of drawings.

Figure 1:
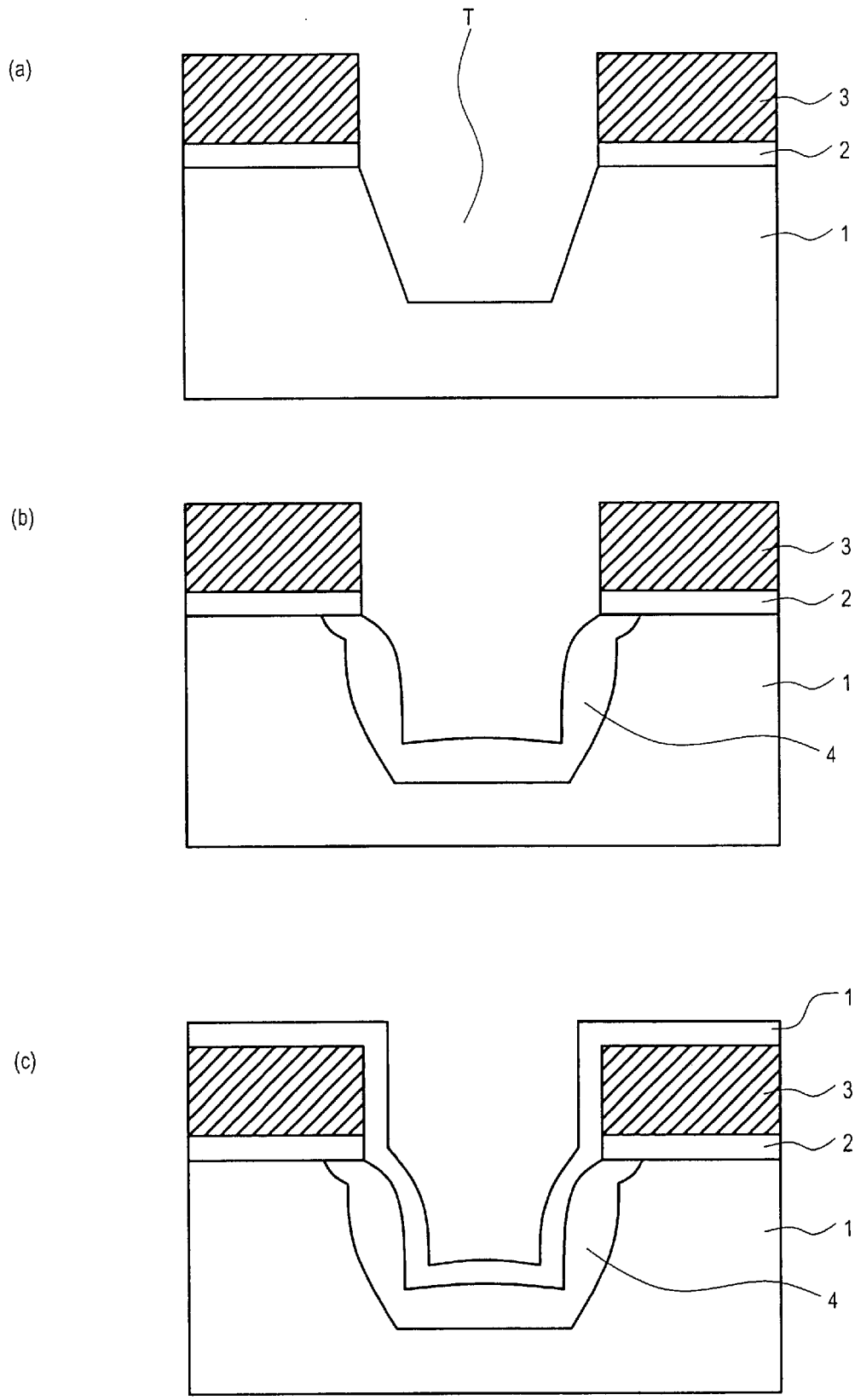
FIGS. 1(a)–(c) are cross sectional views of a semiconductor device according to an embodiment after various processing steps.
Figure 2:
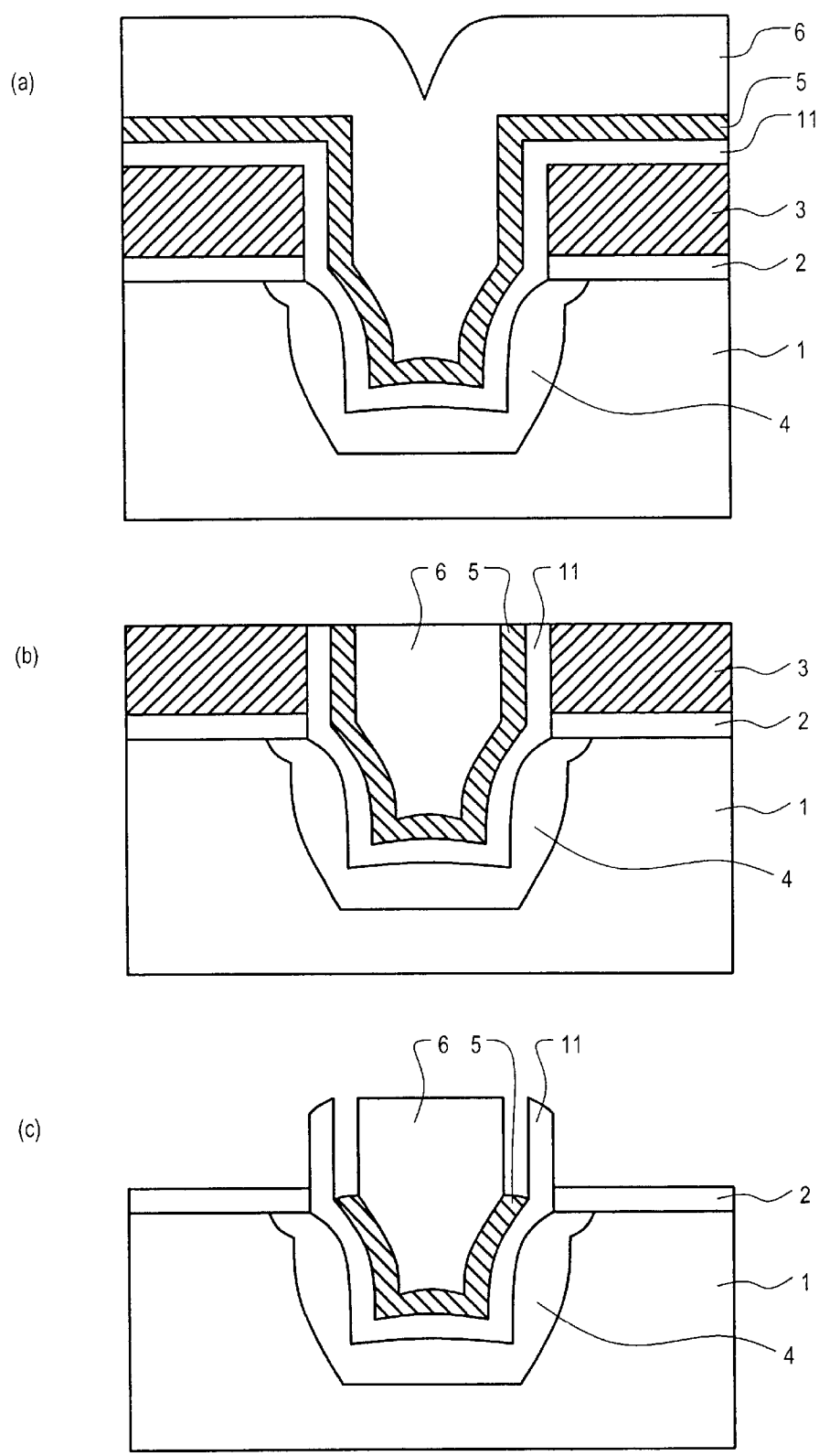
FIGS. 2(a)–(c) are cross sectional views of a semiconductor device according to an embodiment after various processing steps.
Figure 3:
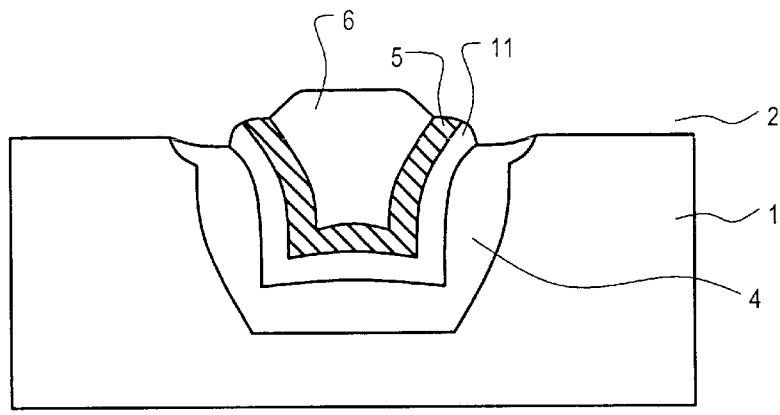
FIG. 3 is a cross sectional view of a semiconductor device according to an embodiment after various processing steps.

FIGS. 1 to 3 are cross sectional views of a semiconductor device after various processing steps according to a first embodiment.

FIGS. 1 to 3 illustrate a method of forming a trench isolation structure (trench isolation method) according to an embodiment of the present invention.

Referring now to FIG. 1(a), a silicon oxide film 2 and a silicon nitride film 3 may be formed sequentially on a silicon substrate 1. Silicon oxide film 2 may have a thickness of about 5 to 30 nm. Silicon nitride film 3 may have a thickness of about 140 to 200 nm. Silicon nitride film 3 may be an oxidation-resistant insulating film. A resist pattern (not shown) may then be formed so as to expose silicon nitride film 3 over a region (a non-active region) where a trench T may be formed. Using the resist pattern as a mask, silicon nitride film 3 and silicon oxide film 2 may be etched sequentially until a surface of silicon substrate 1 is exposed in the non-active region. The resist pattern may then be removed. After the resist pattern is removed, the exposed surface of silicon substrate 1 may be etched using silicon nitride film 3 as a mask. In this way, a trench T may be formed. Trench T may have a depth of about 200 to 500 nm from a substrate plane.

Referring now to FIG. 1(b), a thermal oxide film 4 may then be formed as a first insulating film on an inner wall surface of trench T. Thermal oxide film 4 may have a thickness of about 10 to 20 nm. Thermal oxide film 4 may compensate for damage to the substrate surface caused by etching carried out to form trench T. Thermal oxide film 4 may also prevent dislocations from occurring inside the substrate 1 by rounding off corners of trench T to relieve stress.

Referring now to FIG. 1(c), an insulating film 11 may be formed on the entire main surface of the substrate. Insulating film 11 may provide an etching barrier. A silicon oxide film, or the like, or the like may be used as insulating film 11. An HTO (high temperature oxide), an LP-TEOS-NSG (low pressure tetra ethyl ortho silicate non-doped silicate glass) oxide film, or the like may also be used as insulating film 11, to name just a few examples. Insulating film 11 may be formed by, for example, a low pressure chemical vapor deposition (LPCVD) method that provides excellent film quality and step coverage. Insulating film 11 may have a thickness of about 5 nm to 30 nm. If insulating film 11 is too thin, insulating film 11 may not have sufficient coverage for lateral walls of silicon nitride film 3 to isolate silicon nitride film 3 and nitride film liner 5 (formed later) from each other. As a result, in a subsequent wet etching step for removing silicon nitride film 3, a nitride film liner 5 (formed later) inside trench T may be overly and undesirably etched. Excessive etching of the nitride film liner 5 (formed later) in trench T may generate a groove D (illustrated in FIG. 8(c)), which may cause shorting defects of a gate electrode, and the like. However, if insulating film 11 is too thick, the diameter of the opening of trench T may be too small, thereby lowering the embedding or filling ability of an insulating film to be used to fill trench T.

Figure 8:
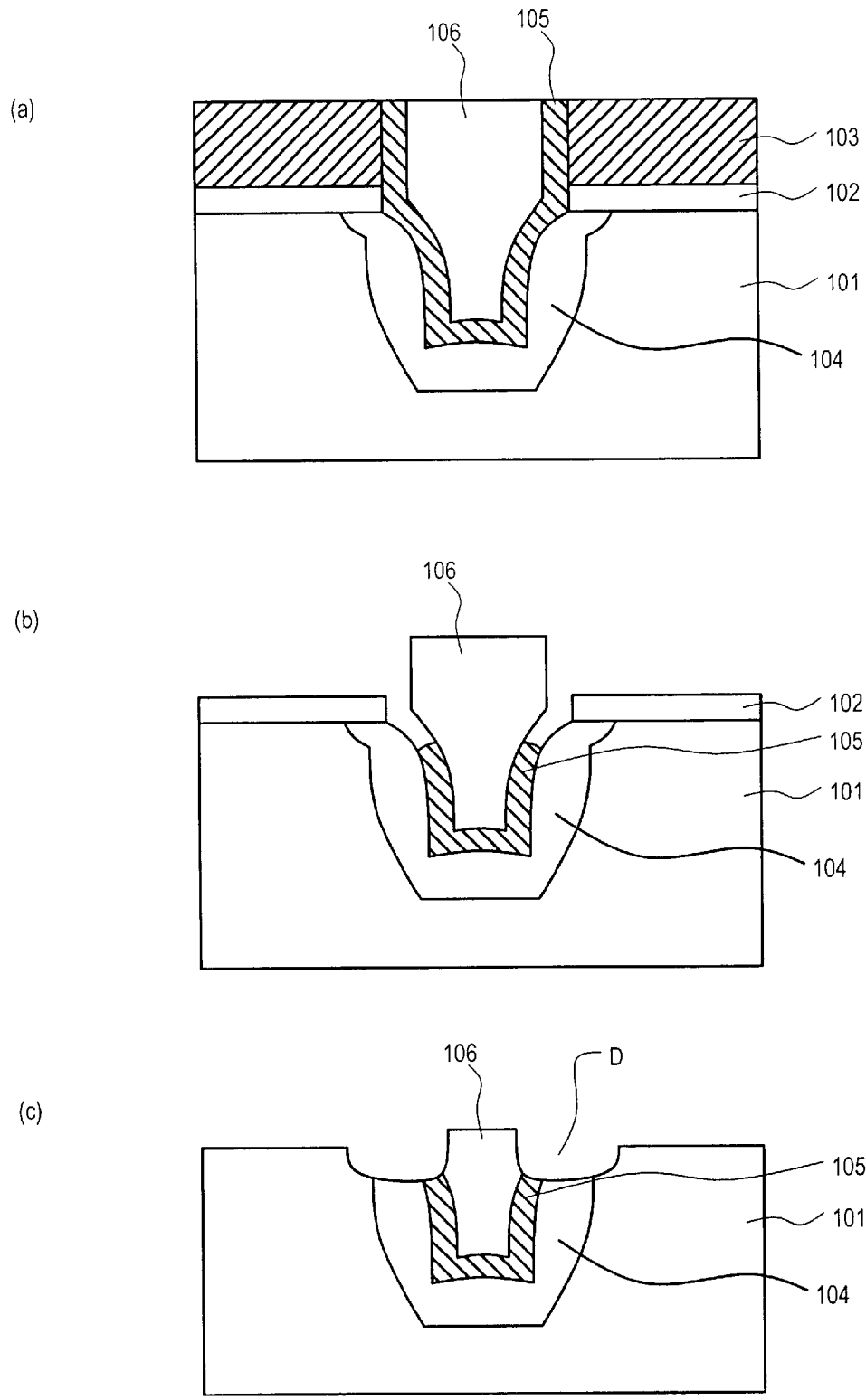
FIGS. 8(a)–(c) are cross-sectional views of a conventional trench isolation structure after various process steps.
Figure 9:
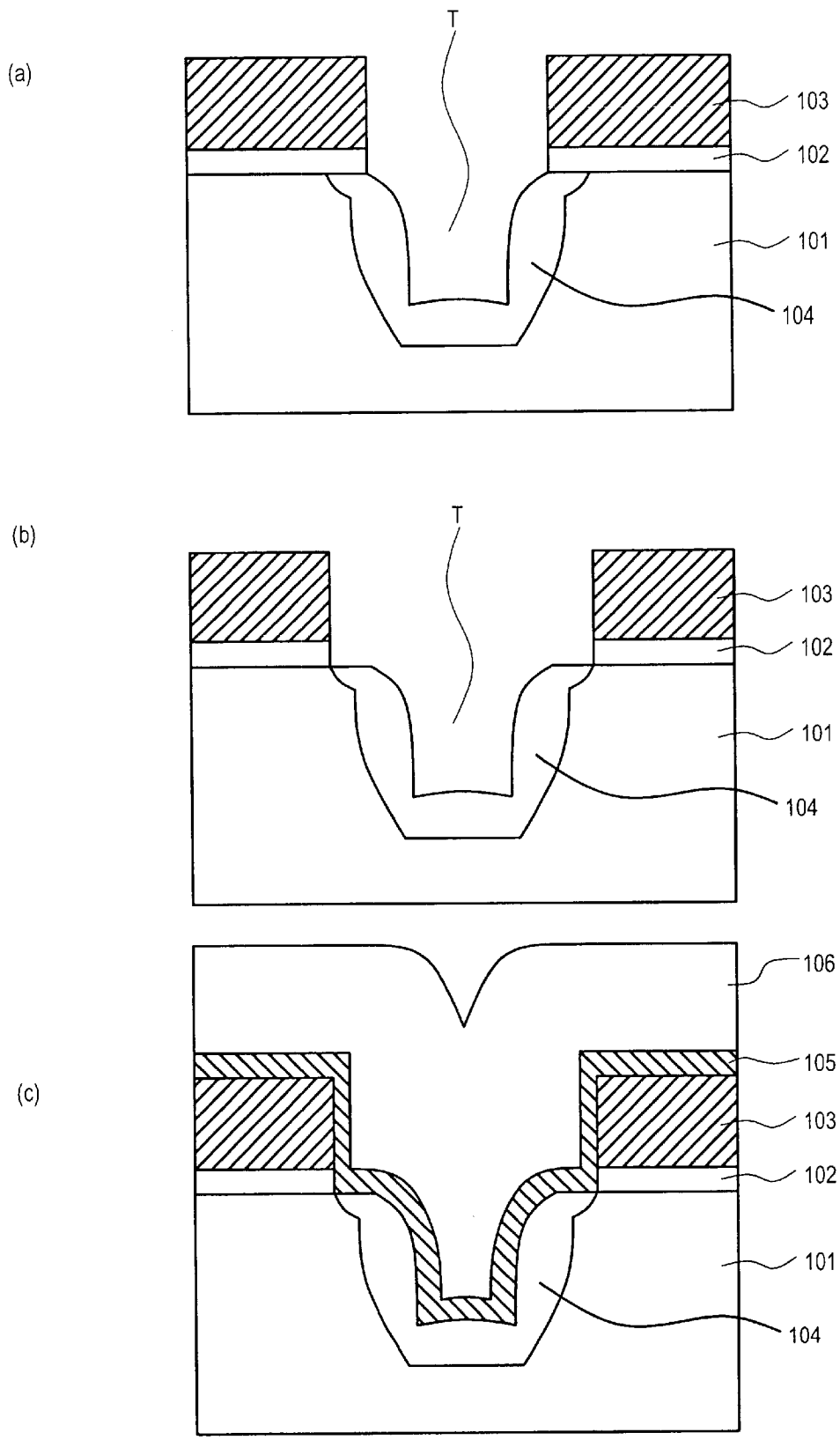
FIGS. 9(a)–(c) are cross-sectional views of a conventional trench isolation structure after various process steps.
Figure 10:
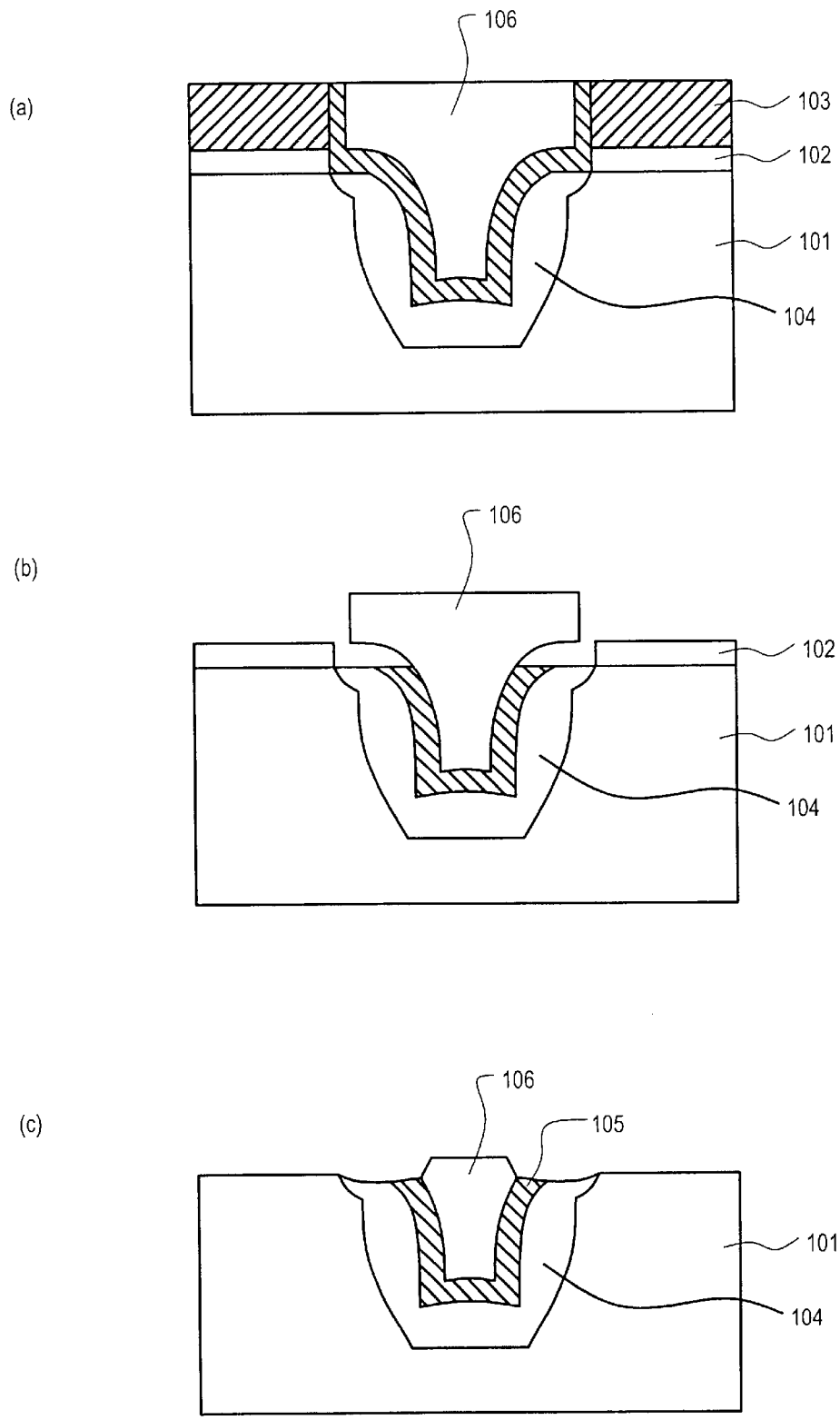
FIGS. 10(a)–(c) are cross-sectional views of a conventional trench isolation structure after various process steps.
Figure 11:
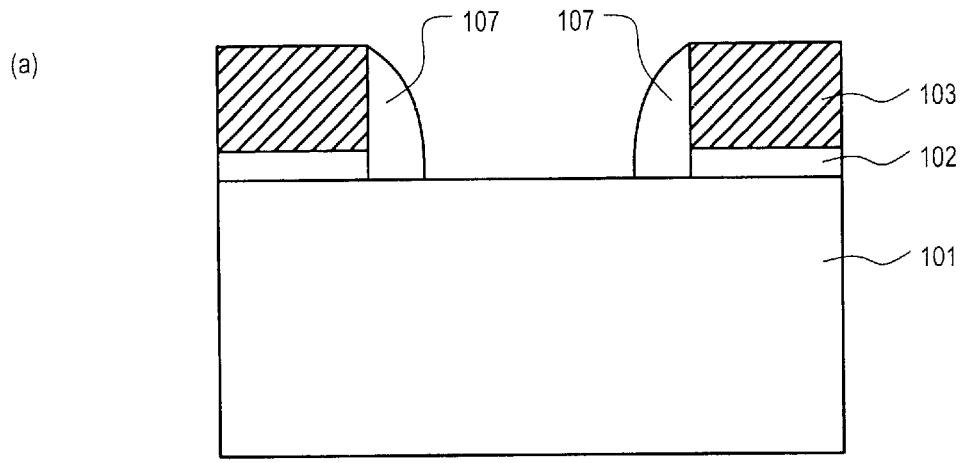
FIGS. 11(a)–(b) are cross-sectional views of a conventional trench isolation structure after various process steps.
Figure 11:
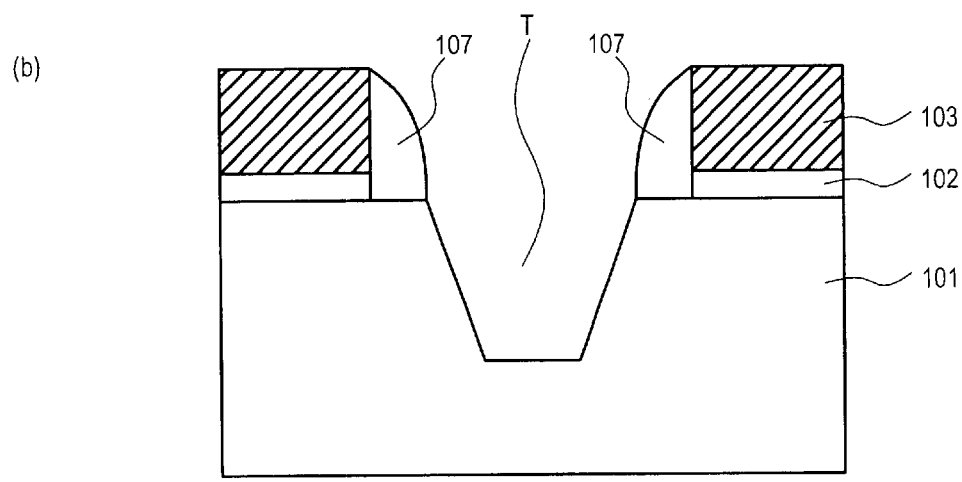
Figure 12:
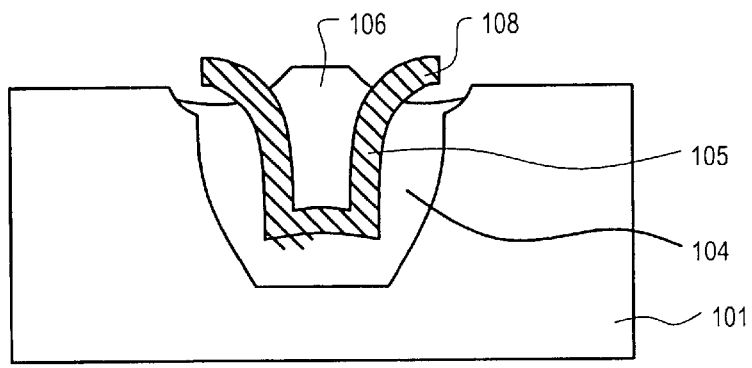
FIG. 12 is a cross-sectional view of a conventional trench isolation structure after various process steps

Referring now to FIG. 2(a), a nitride film liner (silicon nitride film liner) 5 may be formed as a second oxidation-resistant insulating film on the entire main face of substrate 1. Nitride film liner 5 may be formed by, for example, a low pressure CVD providing good film quality and step coverage. A film formation temperature may be set to about 600 to 800° C. Nitride film liner 5 may have a thickness of preferably 4 nm or more, more preferably at least 5 nm, and may be preferably 20 nm or less, more preferably 10 nm or less, and further preferably 7 nm or less. If nitride film liner 5 is excessively thin, an anti-oxidation effect on a portion inside a trench wall may be rendered insufficient. On the other hand, if nitride film liner 5 is excessively thick, a part of silicon nitride film liner 5 inside trench T may also be etched when silicon nitride film 3 is removed by wet etching (described later with reference to FIG. 2(c)). If silicon nitride liner 5 inside trench is over-etched in such a manner, a groove D may be formed as illustrated in FIG. 8(*c*) and discussed in the background. This may cause undesired effects such as a short circuit of gate electrodes, or the like.

An anti-static insulating film (not shown) may be formed on nitride film liner 5 as the need arises. It is preferred to provide the anti-static film in the case where an embedding insulating film 6 (to be formed later) is formed by a plasma CVD method and particularly by a high-density plasma CVD method. The anti-static insulating film may prevent peeling off of an embedding insulating film 6 or nitride film liner 5, which may occur due to charged particles such as plasma generated during growth of the embedding insulating film 6.

An anti-static insulating film may be formed by a CVD method other than a plasma CVD method, i.e. a thermal CVD method, and particularly by a CVD method other than a high-density plasma CVD method. In this way, nitride film liner 5 formed inside the trench may have a reduced electrical charge. Various low pressure CVD methods and normal pressure CVD methods may be used as the thermal CVD method, however, a low pressure CVD method providing excellent film quality and step coverage is preferable.

A variety of oxide films, such as a silicon oxide film, or the like, may be used as an anti-static insulating film. An HTO (high temperature oxide) oxide film, an LP-TEOS-NSG (low pressure tetra ethyl ortho silicate non-doped silicate glass) oxide film, or the like may also be used as ant-static insulating film, to name just a few examples.

An anti-static insulating film may have a thickness of about 5 nm to 30 nm. If an anti-static insulating film is excessively thin, nitride film liner 5 and an embedding insulating film 6 (to be formed later) may not be sufficiently prevented from being peeled off. On the other hand, if an anti-static insulating film is excessively thick, embedding or filling properties provided by embedding insulating film 6 (to be formed later) may deteriorate due to the inside of trench T being excessively narrowed.

Referring still to FIG. 2(*a*), an embedding insulating film 6 may be formed on nitride film liner 5. Embedding insulating film 6 may be an embedded silicon oxide film and may have a thickness of about 400 to 600 nm. Embedding insulating film 6 may be a second insulating film formed by a plasma CVD method, as just one example, so as to essentially fill trench T. A plasma CVD method may preferably be a high-density plasma CVD (a bias high-density plasma CVD) method in terms of embedding or filling properties of trench T and fineness of the film.

A high-density plasma CVD method may be characterized by high embedding properties with respect to a minute concave portion pattern such as illustrated in trench T. A high-density plasma CVD method may employ low-temperature plasma with an ionization density of about $10^{11}$ to $10^{12}/cm^3$ that is higher by about two orders of magnitude than in a normal plasma CVD. In the high-density plasma CVD method, an inductively coupled plasma (ICP) or electron cyclotron resonance (ECR) type chamber structure may be employed that can produce a lot of plasma, which is different from a parallel-plate type used in a normal plasma CVD. A bias may be applied to the substrate in the high-density plasma CVD method. Hence, in respect to substrate potential, the high-density plasma CVD method may differ from a normal plasma CVD method in which the substrate may be maintained at a ground potential or electrically floating.

Conditions for deposition by the high-density plasma CVD method may be as follows, for example. A silane gas, oxygen gas, and argon gas may be used. The silane gas may have a flow rate set to about 50 to 200 sccm (ml/min (normal)). The oxygen gas may have a flow rate set to about 100 to 350 sccm (ml/min (normal)). The argon gas may have a flow rate set to about 50 to 150 sccm (ml/min (normal)). The deposition temperature may be set in the range of about 300 to 900° C. and it is preferable to set the deposition temperature in a range of about 600 to 800° C. Electric power extracted may be set in the range of up to about 5,000 W and it is preferably in the range of about 2,000 to 5,000 W and further preferably in the range of about 3,000 to 4,000 W.

A baking compaction treatment may be carried out for the purpose of increasing density of embedding insulating film 6. This may make it more difficult for embedding insulating film 6 filling the inside of trench T to be etched in a later wet washing step. Examples of the baking compaction treatment include an oxidation treatment at about 800° C. or higher and an annealing treatment at about 1,000° C. or higher in a nitrogen atmosphere.

Referring now to FIG. 2(*b*), embedding insulating film 6, nitride film liner 5, and insulating film 11 may be etched back by chemical mechanical polishing (CMP) or anisotropic etching until silicon nitride film 3 is exposed. In this way, the surface of the semiconductor device may be flattened.

Referring now to FIG. 2(*c*), silicon nitride film 3 over the active region may be removed by wet etching. A hot phosphoric acid solution ($H_3PO_4$), or the like, may be used as an etchant to have a high etching rate (a large selection ratio) for a silicon nitride film with respect to that for a silicon oxide film. The etching conditions with hot phosphoric acid may be in the following ranges in view of treatment time, selection ratio, and the like. A concentration of phosphoric acid of about 80 to 95 wt % and a temperature of about 140 to 200° C. At this time, a portion of nitride film liner 5 sandwiched between embedding insulating film 6 and insulating film 11 may be removed by wet etching from the exposed edge. However, because nitride film liner 5 is formed to have a thin film thickness, nitride film liner 5 may only have a small contact area with the etchant. Thus, the etching rate for this part of nitride film liner 5 may be lower than the etching rage of silicon nitride film 3. In this way, the etching amount of nitride film liner 5 inside the trench may be suppressed in the wet etching step and may be prevented from being excessively etched.

Referring now to FIG. 3, silicon oxide film 2 over an active region and a protruding portions formed of embedding insulating film 6 and insulating film 11 in a non-active region (including an anti-static insulating film, depending on the case) may be removed by a wet washing step (a wet etching treatment for a silicon oxide film) or the like. In this way, a trench isolation structure as illustrated in FIG. 3 may be formed.

Because etching of a part of nitride film liner 5 has been suppressed in an etching step illustrated in FIG. 2(*c*), a size of a groove D formed along an edge of a trench isolation region may be suppressed to some degree. In this way, a failure such as a short circuit or the like in a step of forming gate electrodes may be suppressed. Furthermore, device characteristics, such as a device threshold voltage or the like may not be affected due to an increased electric field in the region and leakage current may be suppressed.

According to the above-mentioned method, a first example (Example 1) of a trench isolation structure has been formed through deposition of an embedding insulating film 6 (silicon oxide film) by a low pressure CVD method so as to obtain a trench isolation structure having a depth of trench T with respect to the substrate plane of about 350 nm. The insulating film 11 for etching barrier (silicon oxide film) has a thickness of about 10 nm and the nitride film liner 5 has a thickness of about 6 nm. As a result, a sufficient trench isolation structure without a groove D was obtained.

According to the above-mentioned method, a second example of a trench isolation structure has been formed through deposition of an embedding insulating film (silicon oxide film) 6 by a high-density plasma CVD method having deposition conditions with a depth of a trench T with respect to a substrate plane set to about 350 nm. The insulating film 11 for etching barrier (silicon oxide film) has a thickness of about 10 nm, nitride film liner 5 has a thickness set to about 6 nm, and an anti-static insulating film 10 has a thickness of about 20 nm. As a result, a groove D was not formed. In addition, a lift due to peeling off or delaminating of embedded insulating film 6 was not observed. As a comparative example, a trench isolation structure was formed in the same way as in Example 2, except the anti-static insulating film and the insulating film 11 for etching barrier were not formed. As a result, a groove D was formed along the trench isolation region and peeling off of the embedding insulating film was observed.

The high-density plasma CVD deposition conditions preferably include:

CVD device: Centura, manufactured by Applied Material Japan Inc.;

Deposition temperature: 730° C.;

Electric power extracted: 3500 W;

Gas conditions: a SiH$_4$ gas flow rate of 120 sccm (ml/min (normal)), an O$_2$ gas flow rate of 260 sccm (ml/min (normal)), and an Ar gas flow rate of 90 sccm (ml/min (normal));

DS (deposition/sputter rate): 4.6.

Figure 4:
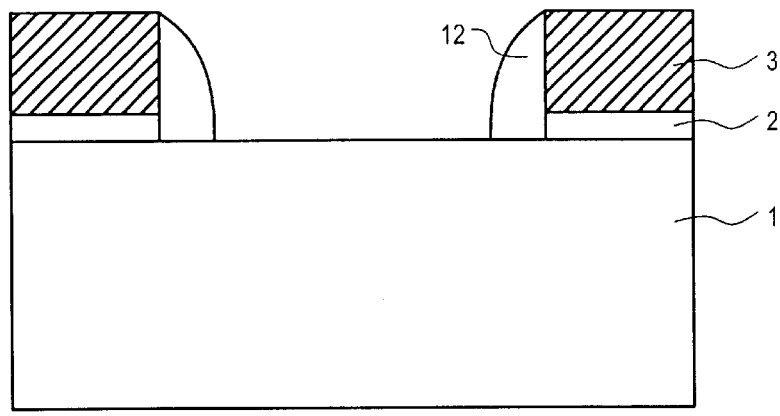
FIGS. 4(a)–(b) are cross sectional views of a semiconductor device according to an embodiment after various processing steps.
Figure 4:
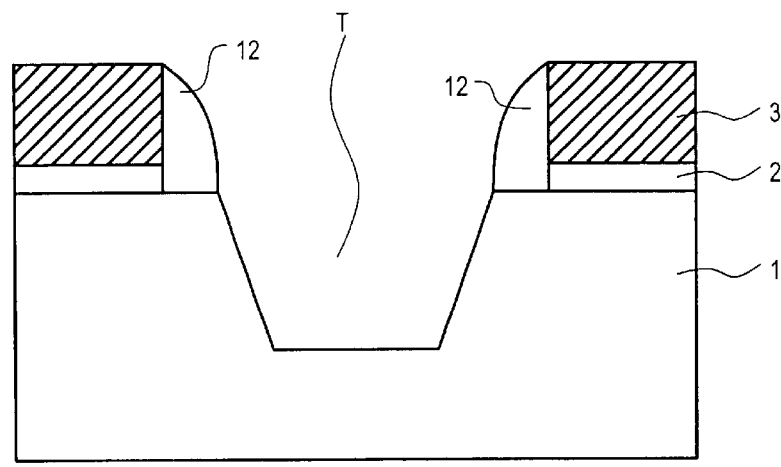
Figure 5:
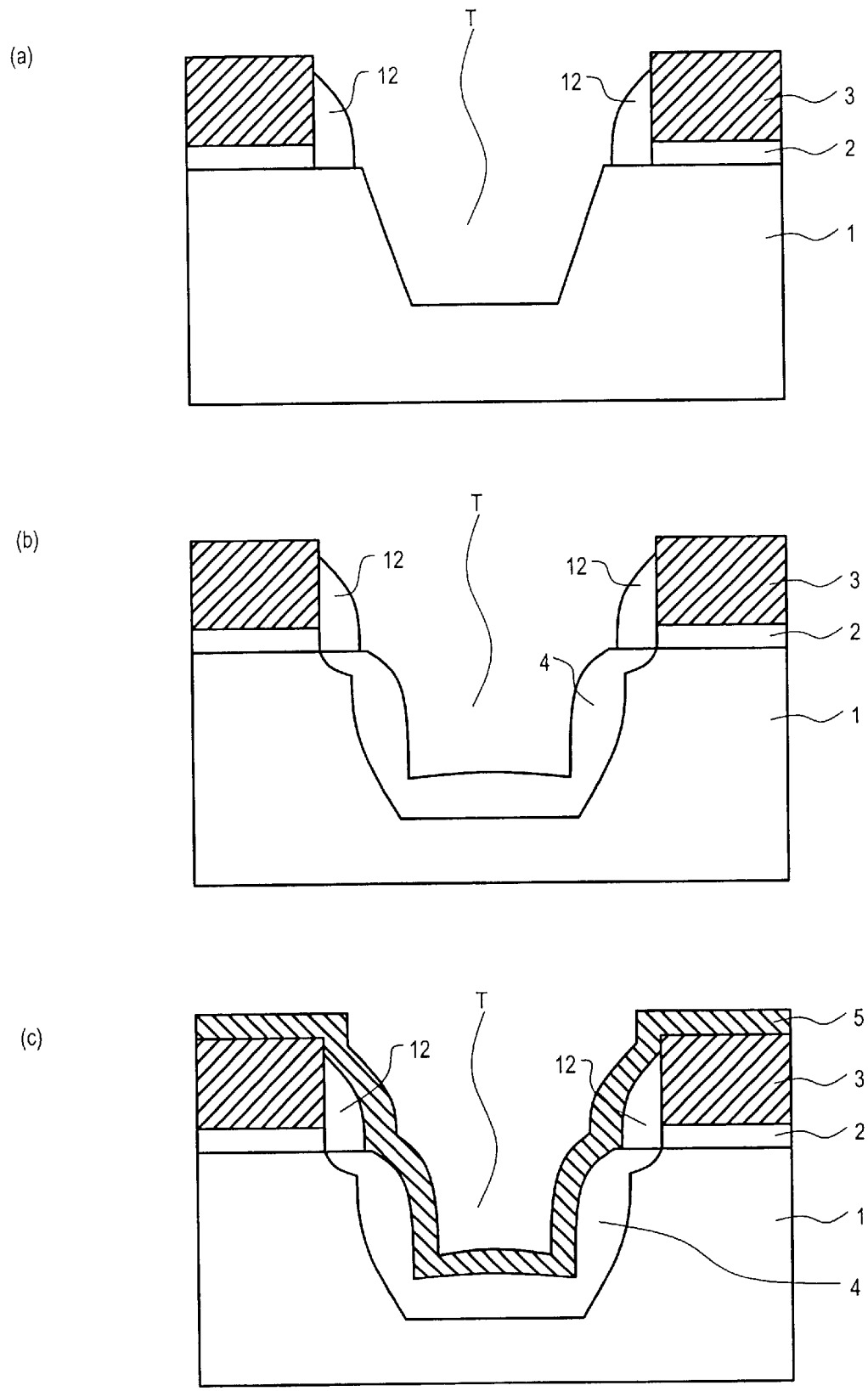
FIGS. 5(a)–(c) are cross sectional views of a semiconductor device according to an embodiment after various processing steps.
Figure 6:
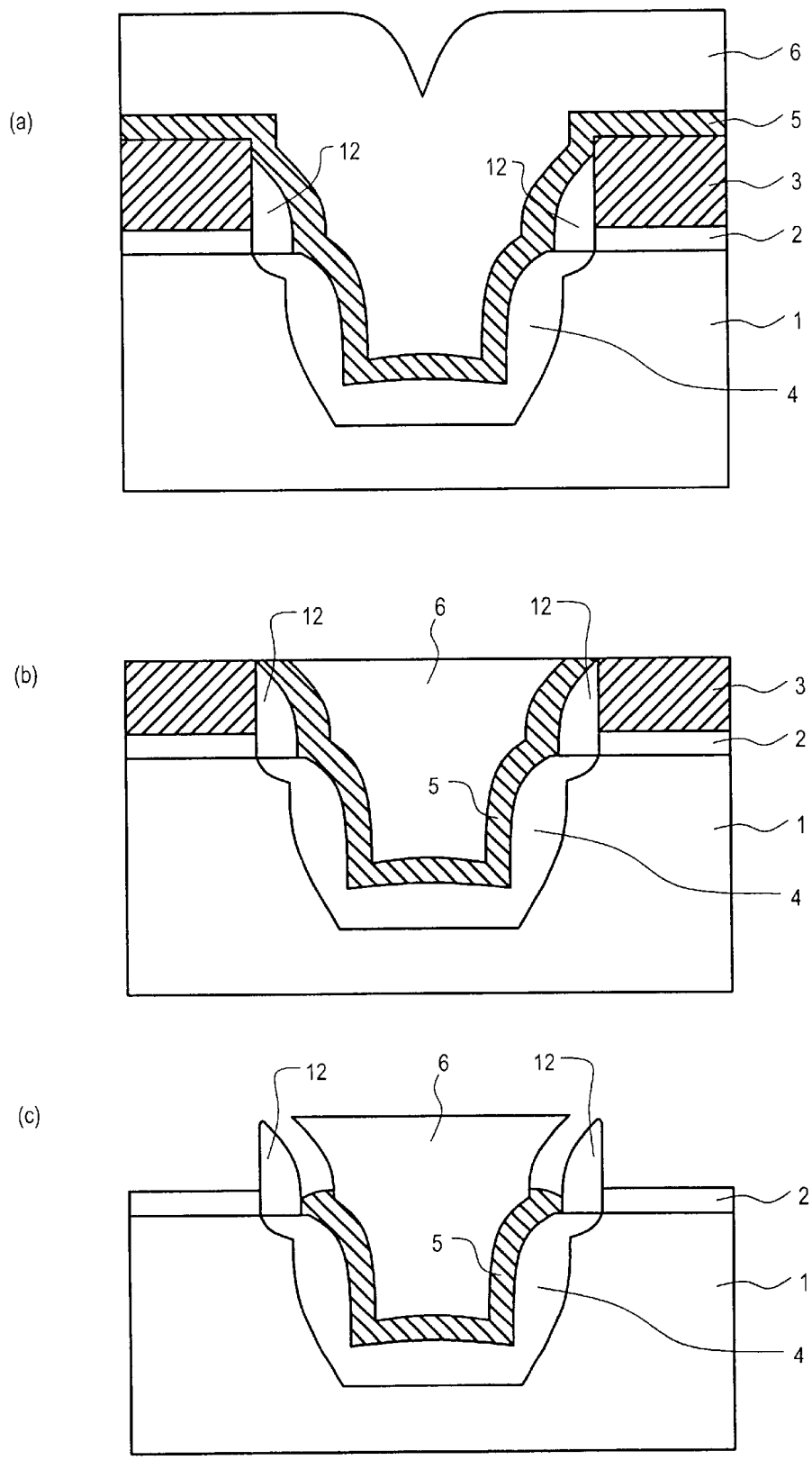
FIGS. 6(a)–(c) are cross sectional views of a semiconductor device according to an embodiment after various processing steps.
Figure 7:
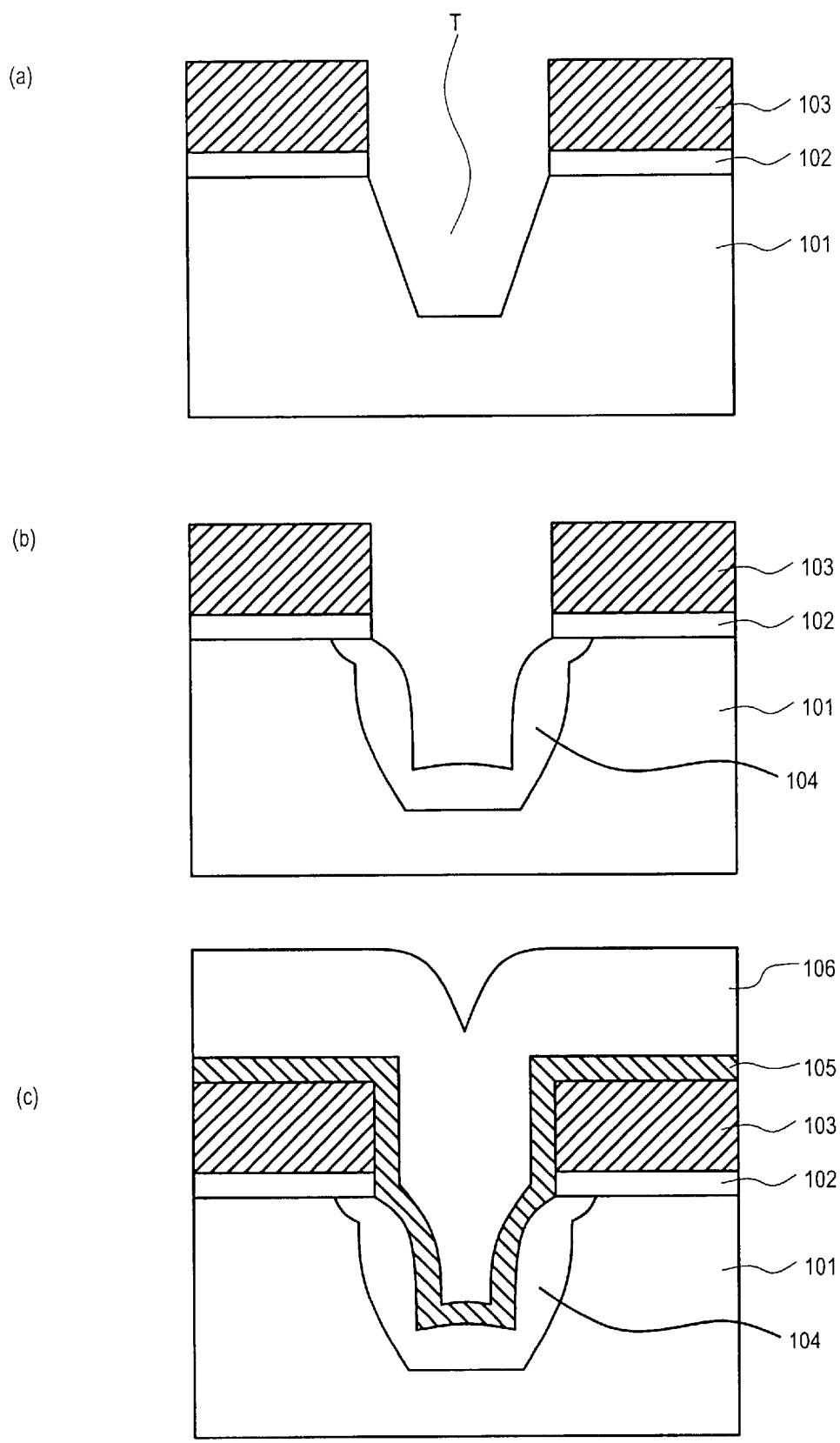
FIGS. 7(a)–(c) are cross-sectional views of a conventional trench isolation structure after various process steps.

FIGS. 4 to 6 are cross sectional views of a semiconductor device after various processing steps according to a second embodiment.

FIGS. 4 to 6 illustrate a method of forming a trench isolation structure (trench isolation method) according to an embodiment of the present invention.

FIGS. 4 to 6 may include similar constituents as illustrated in FIGS. 1 to 3 and may be referred to by the same reference character.

Referring now to FIG. 4(a), similar to the first embodiment, a silicon oxide film 2 and a silicon nitride film 3 (first oxidation-resistant insulating film) may be sequentially formed as mask layers on a semiconductor substrate. Next, a resist pattern (not shown) may be formed so as to expose a portion of silicon nitride film over a region, which may be slightly larger than the region where a trench T is to be formed. Silicon nitride film 3 and silicon oxide film 2 may be sequentially etched to expose the surface of silicon substrate 1 using the resist pattern as a mask.

After removal of the resist pattern, an insulating film for sidewall may be formed on the entire main surface of substrate 1. The insulating film for sidewall may then be etched back by anisotropic etching. In this way, sidewalls 12 may be formed on the lateral walls of an opening formed through silicon nitride film 3 and silicon oxide film 2. Sidewalls 12 may be a silicon oxide film formed by a low pressure CVD method, or the like. The insulating film for sidewall 12 may be formed to have a thickness of about 10 to 100 nm in view of an amount of etching in a later substrate washing step.

Referring now to FIG. 4(b), an exposed surface of silicon substrate 1 may be etched to form a trench T using silicon nitride film 3 and sidewalls 12 as a mask.

Referring now to FIG. 5(a), substrate washing (wet etching) may be conducted to remove a deposit that may be generated and adhered due to the etching. For this substrate washing, a treatment time period, an etchant, a concentration, and the like, may be selected so that a portion of sidewalls 12 remain having a width of at least about 5 to 30 nm (length in a direction of the substrate plane). At this point, it is preferred that a remaining portion of sidewalls 12 after the substrate washing has a sufficient height (length in a direction vertical to the substrate plane) that may allow coverage of lateral walls of an opening through silicon nitride film 3 after a later planarization treatment.

A width of sidewalls 12 may not be set to such a small value that permits removal of sidewalls 12 in a washing step for removing a deposit after formation of trench T. If sidewalls 12 have such a small width, silicon nitride film 3 and a nitride film liner 5 (FIG. 5(c)) may not be isolated from each other. In this case, nitride film liner 5 may be excessively etched such that the etching may reach inside trench T in a later wet etching step for removing silicon nitride film 3. However, in order to provide densely arranged devices, so that chip area may not be wasted, the width of sidewalls 12 may not be set to too large a value.

Referring now to FIG. 5(b), a thermal oxide film 4 may be formed as a first insulating film on the inner wall of trench T. Thermal oxide film 4 may have a thickness of about 10 to 20 nm.

Referring now to FIG. 5(c), in a similar manner as in the first embodiment, a nitride film liner 5 may be formed on the entire main surface of substrate 1 as the need arises to form a second oxidation-resistant insulating film.

Referring now to FIG. 6(a), an embedding insulating film 6 may be formed so as to essentially fill the inside of trench T.

Referring now to FIG. 6(b), embedding insulating film 6 and nitride film liner 5 may be etched back by CMP or anisotropic etching. In this way, silicon nitride film 3 may be exposed and the main surface of the substrate may be made planar or flattened.

Referring now to FIG. 6(c), silicon nitride film 3 on an active region may be removed by anisotropic etching. Anisotropic etching may include, for example, wet etching using a phosphoric acid solution, or the like. By this process, nitride film liner 5 sandwiched between embedding insulating film 6 and sidewalls 12 may be removed by etching the exposed edge. Sidewalls 12 may serve as etching barrier films. Nitride film liner 5 between embedding insulating film 6 and sidewalls 12 may have a small area exposed to the etchant. Thus, the etching rate for nitride film liner 5 may be lower than the etching rate for silicon nitride film 3. As a result, even though silicon nitride film 3 may be completely removed, excessive etching of nitride film liner 5 may be suppressed so that etching of nitride film liner 5 within the trench may be prevented.

Next, silicon oxide film 2 over an active region and a protruding portions formed of embedding insulating film 6 and sidewalls 11 in a non-active region (including an anti-static insulating film, depending on the case) may be removed by a wet washing step (a wet etching treatment for a silicon oxide film) or the like. In this way, a trench isolation structure as illustrated in FIG. 3 may be formed. Because nitride film liner 5 within the trench may not be etched below essentially the substrate plane during steps as illustrated in FIG. 6(c), a groove may not be formed along edges of the trench isolation region.

According to the present embodiments, because etching barrier films may be formed on lateral walls of an etching stopper film (for example, a nitride film), excessive etching of the etching stopper film (portions inside a concave portion of the substrate) may be prevented in an etching step. The etching step may include an etching step for removing a mask layer (for example, a nitride film), which may be used to form the concave portion in the substrate. As a result, an isolation structure may be formed without a groove along the edge of a concave region, such as a trench. In this way, unwanted portions of a material, such as a gate electrode material, may be prevented from remaining after the formation of a gate pattern. Consequently, a device isolation structure, such as a trench isolation structure may be formed with sufficient isolation characteristics while reducing certain unwanted characteristics that may increase the likelihood of defects.

A thin insulating film spacer may be formed on lateral walls of an etching stopper film (for example, a nitride film). However, the spacer may not be formed in the concave portion of the substrate. As a result, a width of the spacer may be reduced with respect to an area of the active region. In this way, a width of the etching stopper film may be reduced and less chip area may be consumed.

An embedding insulating film may be formed on an anti-static insulating film in a concave portion of a substrate and over an etching stopper film on other portions of a substrate. In this way, peeling or delamination of the film, which may occur due to effects of charged particles during a forming of the embedding insulating film by a plasma CVD method or a high-density plasma CVD method providing excellent embedding ability, may be reduced. Because a film formation method having excellent embedding ability or filling properties may be employed, a minute concave portion may be sufficiently filled.

It is understood that the embodiments described above are exemplary and the present invention should not be limited to those embodiments. Specific structures should not be limited to the described embodiments.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A method of forming a trench isolation structure in a semiconductor device, comprising the steps of:
   forming a mask layer including a first oxidation-resistant insulating film on a semiconductor substrate and then forming a predetermined opening pattern in the mask layer;
   etching an exposed portion of the semiconductor substrate using at least the mask layer as a mask to form a trench;
   forming a first insulating film on an inner wall of the trench;
   forming an etching barrier layer on at least a side portion of the mask layer at the predetermined opening pattern;
   forming a second oxidation-resistant insulating film on the inner wall of the trench including on the etching barrier layer;
   forming a second insulating film to essentially fill the trench;
   conducting a planarization treatment so that the first oxidation-resistant insulating film of the mask layer is exposed; and
   essentially removing the mask layer by etching that also etches an exposed edge of the second oxidation-resistant insulating film.

2. The method of forming a trench isolation structure in a semiconductor device according to claim 1, wherein:
   the etching barrier layer is formed on inner walls of the trench and at least a side portion of the mask layer.

3. The method of forming a trench isolation structure in a semiconductor device according to claim 1, wherein:
   the etching barrier layer includes an oxide film having a thickness of about 5 nm to 30 nm.

4. The method of forming a trench isolation structure in a semiconductor device according to claim 1, further including the step of:
   the first oxidation-resistant insulating film includes a first nitride film; and
   the second oxidation-resistant insulating film includes a second nitride film having a thickness of about 4 nm to 20 nm.

5. The method of forming a trench isolation structure in a semiconductor device according to claim 1, further including the step of:
   forming an anti-static insulating film on the second oxidation-resistant insulating film by a thermal chemical vapor deposition (CVD) method wherein the second insulating film is formed by a plasma CVD method.

6. The method of forming a trench isolation structure in a semiconductor device according to claim 5, wherein:
   the plasma CVD method is a high-density plasma CVD method.

7. The method of forming a trench isolation structure in a semiconductor device according to claim 5, wherein:
   the anti-static insulating film includes an oxide film having a thickness of about 5 nm to 30 nm.

8. The method of forming a trench isolation structure in a semiconductor device according to claim 1, wherein:
   the first insulating film includes a thermal oxide film.

9. A method of forming a trench isolation structure in a semiconductor device, comprising the steps of:
   forming a mask layer including a first oxidation-resistant insulating film on a semiconductor substrate and then forming a predetermined opening pattern in the mask layer;
   forming an insulating film on a main surface of the semiconductor substrate and etching back the insulating film by anisotropic etching to form a sidewall on a lateral wall of an inside of the opening pattern in the mask layer;
   etching an exposed portion of the semiconductor substrate using at least the mask layer and the sidewall as masks to form a trench;
   forming a first insulating film on an inner wall of the trench;
   forming a second oxidation-resistant insulating film on the main surface of the semiconductor substrate including an inner wall of the trench;
   forming a second insulating film to essentially fill the trench;
   conducting a planarization treatment so that the first oxidation-resistant insulating film of the mask layer and the second oxidation-resistant insulating film are exposed; and
   essentially removing the mask layer by etching.

10. The method of forming a trench isolation structure in a semiconductor device according to claim 9, wherein:
    the sidewall includes an oxide film having a thickness of about 10 nm to 100 nm.

11. The method of forming a trench isolation structure in a semiconductor device according to claim 9, wherein:
   the first oxidation-resistant insulating film includes a first nitride film; and
   the second oxidation-resistant film includes a second nitride film having a thickness of about 4 nm to 20 nm.

12. The method of forming a trench isolation structure in a semiconductor device according to claim 9, wherein:
   the oxidation-resistant insulating film includes a nitride film having a thickness of about 4 nm to 20 nm.

13. The method of forming a trench isolation structure in a semiconductor device according to claim 9, wherein:
   forming an anti-static insulating film on the second oxidation-resistant insulating film by a thermal chemical vapor deposition (CVD) method wherein the second insulating film is formed by a plasma CVD method.

14. The method of forming a trench isolation structure in a semiconductor device according to claim 13, wherein:
   the anti-static insulating film includes an oxide film having a thickness of about 5 nm to 30 nm.

15. The method of forming a trench isolation structure in a semiconductor device according to claim 9, wherein:
   the first insulating film includes a thermal oxide film.

* * * * *